United States Patent
Zhang

(10) Patent No.: US 12,243,481 B2
(45) Date of Patent: Mar. 4, 2025

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Shuyuan Zhang, Wuhan (CN)

(73) Assignee: WHUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 18/029,479

(22) PCT Filed: Mar. 29, 2023

(86) PCT No.: PCT/CN2023/084584
§ 371 (c)(1),
(2) Date: Mar. 30, 2023

(87) PCT Pub. No.: WO2024/016717
PCT Pub. Date: Jan. 25, 2024

(65) Prior Publication Data
US 2024/0371321 A1    Nov. 7, 2024

(30) Foreign Application Priority Data
Jul. 20, 2022    (CN) .......................... 202210862525.0

(51) Int. Cl.
*G09G 3/3233*    (2016.01)
*H10K 59/121*    (2023.01)
(52) U.S. Cl.
CPC ....... *G09G 3/3233* (2013.01); *H10K 59/1213* (2023.02); *G09G 2300/0452* (2013.01);
(Continued)

(58) Field of Classification Search
CPC ... G09G 3/30–3291; G09G 2300/0819; G09G 2300/0842–0871; G09G 2310/08;
(Continued)

(56) References Cited

U.S. PATENT DOCUMENTS

| | | | |
|---|---|---|---|
| 2014/0035798 A1* | 2/2014 | Kawada | G09G 3/3233 345/77 |
| 2015/0077413 A1 | 3/2015 | Kim | |

(Continued)

FOREIGN PATENT DOCUMENTS

| | | |
|---|---|---|
| CN | 1580922 A | 2/2005 |
| CN | 101916019 A | 12/2010 |

(Continued)

OTHER PUBLICATIONS

PCT International Search Report for International Application No. PCT/CN2023/084584, mailed on Jul. 7, 2023, 9pp.
PCT Written Opinion of the International Searching Authority for International Application No. PCT/CN2023/084584, mailed on Jul. 14, 2023, 10pp.

*Primary Examiner* — Amy Onyekaba
(74) *Attorney, Agent, or Firm* — The Roy Gross Law Firm, LLC; Roy Gross

(57) ABSTRACT

A display panel and a display device are provided. A second transistor of a first pixel driving circuit is connected to a reset signal line and a first light emitting device, and a second transistor of a second pixel driving circuit is connected to the reset signal line and a second light emitting device. A first light emitting device emits first color light having a first wavelength and a second light emitting device emits second color light having a second wavelength. The first wavelength is greater than the second wavelength. The reset signal line and first node of the first pixel driving circuit have a first coupling capacitor, the reset signal line and the first node of the second pixel driving circuit have a second coupling capacitor, and a first coupling capacitance of the (Continued)

first coupling capacitor is greater than a second coupling capacitance of the second coupling capacitor.

20 Claims, 4 Drawing Sheets

(52) U.S. Cl.
CPC ............... *G09G 2300/0852* (2013.01); *G09G 2300/0861* (2013.01); *G09G 2320/0233* (2013.01); *G09G 2320/0242* (2013.01); *G09G 2340/0435* (2013.01)

(58) Field of Classification Search
CPC ......... G09G 3/3233; G09G 2300/0452; G09G 2300/0852; G09G 2300/0861; G09G 2320/0233; G09G 2320/0242; G09G 2340/0435; H10K 59/1213
See application file for complete search history.

(56) References Cited

U.S. PATENT DOCUMENTS

| | | | | |
|---|---|---|---|---|
| 2017/0124953 | A1* | 5/2017 | Shim | G09G 3/2018 |
| 2021/0407415 | A1* | 12/2021 | Hou | G09G 3/3233 |
| 2022/0028338 | A1* | 1/2022 | Yang | G09G 3/3233 |
| 2022/0344416 | A1* | 10/2022 | Park | H10K 59/65 |

FOREIGN PATENT DOCUMENTS

| | | |
|---|---|---|
| CN | 111862890 A | 10/2020 |
| CN | 112117320 A | 12/2020 |
| CN | 114464134 A | 5/2022 |
| CN | 114724514 A | 7/2022 |
| CN | 115148143 A | 10/2022 |

* cited by examiner

DISPLAY PANEL AND DISPLAY DEVICE

CROSS REFERENCE TO RELATED APPLICATIONS

This application is a National Phase of PCT Patent Application No. PCT/CN2023/084584 having International filing date of Mar. 29, 2023, which claims the benefit of priority of Chinese Patent Application No. 202210862525.0, filed Jul. 20, 2022, the contents of which are all incorporated herein by reference in their entirety.

FIELD OF THE DISCLOSURE

The present disclosure relates to a display technology, and more particularly, to a display panel and a display device.

BACKGROUND

Display panels made with LTPO (Low Temperature Polycrystalline Oxide) backplanes have adaptive refresh rate technology. This technology could save power consumption of display panels. However, after switching from a high refresh rate to a low refresh rate, the sub-pixels of different colors change their luminance in different degrees, resulting in an abnormal color mixing in the display panel, which affects the customer experience.

SUMMARY

Technical Problem

One objective of an embodiment of the present disclosure is to provide a display panel and a display device, which can improve the above-mentioned issue that the display panel has an abnormal color mixing after switching from a high refresh rate to a low refresh rate, due to the different degrees of change in luminance of the light emitting devices of different colors.

Technical Solution

According to an embodiment of the present disclosure, a display panel is disclosed. The display panel comprises a substrate, a driving circuit layer and a light emitting device layer.

The driving circuit layer is disposed on one side of the substrate. The driving circuit layer comprises: a plurality of pixel driving circuits, each comprising a first transistor, a second transistor and a first node, wherein a gate of the first transistor is electrically connected to the first node, a source and a drain of the first transistor and a corresponding light emitting device are electrically connected between the first voltage terminal and the second voltage terminal, a source and a drain of the second transistor are electrically connected between a reset signal line and a corresponding anode of the corresponding light emitting device. The light emitting device layer is disposed on a side of the driving circuit layer facing away from the substrate. The light emitting device layer comprises: a plurality of the light emitting devices, comprising a first light emitting device and a second light emitting device. The first light emitting device is configured to emit a first color light having a first wavelength. The second light emitting device is configured to emit a second color light having a second wavelength. The plurality of the pixel driving circuit comprises a first pixel driving circuit and a second pixel driving circuit. The first pixel driving circuit is electrically connected to the first light emitting device, and the second pixel driving circuit is electrically connected to the second light emitting device.

The first wavelength is greater than the second wavelength. The reset signal line and the first node of the first pixel driving circuit have a first coupling capacitor, and the reset signal line and the first node of the second pixel driving circuit have a second coupling capacitor. A first coupling capacitance of the first coupling capacitor is greater than a second coupling capacitance of the second coupling capacitor.

Optionally, in some embodiments, each pixel driving circuit further comprises a third transistor, a source and a drain of the third transistor are electrically connected between a gate reset signal line and the first node.

The display panel further comprises a plurality of first gating driving circuits, electrically connected to gates of the second transistors in the plurality of pixel driving circuits. A plurality of second gating driving circuits, electrically connected to gates of the third transistors in the plurality of pixel driving circuits.

Within a write-in frame of a display period, a second scan signal outputted by each second gating driving circuit comprises at least one valid pulse, and a first scan signal outputted by each first gating driving circuit comprises at least one valid pulse. Within a maintaining frame of the display period, the first scan signal outputted by each of the first gating driving circuits comprises at least one valid pulse.

Optionally, in some embodiments, the plurality of the light emitting device further comprises a third light emitting device, configured to emit a third color light having a third wavelength, shorter than the second wavelength. The plurality of the pixel driving circuit further comprises a third pixel driving circuit, and a third coupling capacitor is electrically connected between the reset signal line and the first node of the third pixel driving circuit. The second coupling capacitance of the second coupling capacitor is greater than a third coupling capacitance of the third coupling capacitor.

Optionally, in some embodiments, the first coupling capacitance is 1.1 times to 2.2 times of the second coupling capacitance, and the third coupling capacitance is 0.2 times to 0.9 times of the second coupling capacitance.

Optionally, in some embodiments, the first coupling capacitance ranges between 0.3 F and 0.6 farad (F), the second coupling capacitance ranges between 0.3 F and 0.6 F, and the third coupling capacitance ranges between 0.3 F and 0.6 F.

Optionally, in some embodiments, the driving circuit layer comprises: a first active layer and a source/drain layer. The first active layer includes a plurality of spaced-positioned first portions, each of the first portion comprising a first sub-portion, a second sub-portion, and a third sub-portion. The second sub-portion and the third sub-portion respectively extend from both ends of the first sub-portion in the direction away from the first sub-portion and are disposed in a way diverging from each other, and a conductivity of the first sub-portion is higher than conductivities of the second sub-portion and the third sub-portion. The source/drain layer is placed above the first active layer, comprising the reset signal line, which at least partially overlaps with the first sub-portion to form a vertical coupling capacitor. The first coupling capacitor, the second coupling capacitor, and the third coupling capacitor all include the vertical coupling capacitor.

Optionally, in some embodiments, an overlapping area of the first sub-portion of the first pixel driving circuit and the reset signal line is greater than an overlapping area of the first sub-portion of the second pixel driving circuit and the reset signal line; and the overlapping area of the first sub-portion of the second pixel driving circuit and the reset signal line is greater than an overlapping area of the first sub-portion of the third pixel driving circuit and the reset signal line.

Optionally, in some embodiments, each of the pixel driving circuits further comprises a fourth transistor, wherein a gate of the fourth transistor is electrically connected to a corresponding second gating driving circuit, a source and a drain of the fourth transistor are electrically connected between the first node and one of the source and the drain of the first transistor. The driving circuit layer further comprises a second active layer, located under the first active layer, comprising a silicon semiconductor material, wherein the second active layer comprises an active pattern of the first transistor and an active pattern of the second transistor.

The first active layer comprises a metal oxide semiconductor material; and the first active layer comprises an active pattern of the third transistor and an active pattern of the fourth transistor.

Optionally, in some embodiments, a width of the first sub-portion along the first direction is greater than a width of the second sub-portion and the third sub-portion along the first direction, and the first direction intersects an extension direction of the second sub-portion and the third sub-portion. The second sub-portion is configured as the active pattern of the fourth transistor, the third sub-portion is configured as the active pattern of the third transistor, and the first sub-portion is configured to electrically connect the second sub-portion and the third sub-portion.

Optionally, in some embodiments, the source/drain layer further comprises a second part arranged at an interval with the reset signal line, the second part is electrically connected between the first sub-portion and the first node, and the second part and the reset signal line form a parallel coupling capacitor. The first coupling capacitor, the second coupling capacitor, and the third coupling capacitor all include the parallel coupling capacitor.

Optionally, in some embodiments, the second part of each pixel driving circuit comprises a first side close to the reset signal line. A length of the first side of the first pixel driving circuit exactly facing a corresponding reset signal line is greater than a length of the first side of the second pixel driving circuit exactly facing a corresponding reset signal line. A length of the first side of the second pixel driving circuit exactly facing the corresponding reset signal line is greater than a length of the first side of the third pixel driving circuit exactly facing a corresponding reset signal line.

Optionally, in some embodiments, a reset signal transmitted by the reset signal line has a first voltage level in a write-in frame of the display period, the reset signal has a second voltage level in the maintaining frame. The first voltage level is higher than the second voltage level.

Optionally, in some embodiments, each of the pixel driving circuits further comprises a fifth transistor, a gate of the fifth transistor is electrically connected to a corresponding first gating driving circuit, a source and a drain of the fifth transistor are electrically connected between the data line and the source and the drain of the first transistor.

A data signal transmitted by a data line has a third voltage level in the write-in frame, the data signal has a fourth voltage level in the maintaining frame, the third voltage value is not equal to the fourth voltage value. A timing when the data signal jumps from the third voltage level to the fourth voltage level is identical to a timing when the reset signal jumps from the first voltage level to the second voltage level.

Optionally, in some embodiments, the display panel further comprises a plurality of third gating driving circuits. Each of the pixel driving circuits further comprises a sixth transistor, a seventh transistor, and a first capacitor. A source and a drain of the sixth transistor are electrically connected between a second voltage terminal and one of the source and the drain of the first transistor. A gate of the sixth transistor and a gate of the seventh transistor are electrically connected to a corresponding third gating driving circuit, a source and a drain of the seventh transistor are electrically connected between one of the source and the drain of the first transistor and a corresponding light emitting device. The first capacitor is connected in series between the first node and the second voltage terminal.

Optionally, in some embodiments, the first color light is red light, the second color light is green light, and the third color light is blue light.

The present disclosure also proposes a display device having the display panel as provided above.

Advantageous Effect

In contrast to the conventional art, the present disclosure provides a display panel and a display device. The display panel comprises a substrate, a driving circuit layer and a light emitting device layer.

The driving circuit layer is disposed on one side of the substrate. The driving circuit layer comprises: a plurality of pixel driving circuits, each comprising a first transistor, a second transistor and a first node, wherein a gate of the first transistor is electrically connected to the first node, a source and a drain of the first transistor and a corresponding light emitting device are electrically connected between the first voltage terminal and the second voltage terminal, a source and a drain of the second transistor are electrically connected between a reset signal line and a corresponding anode of the corresponding light emitting device. The light emitting device layer is disposed on a side of the driving circuit layer facing away from the substrate. The light emitting device layer comprises: a plurality of the light emitting devices, comprising a first light emitting device and a second light emitting device. The first light emitting device is configured to emit a first color light having a first wavelength. The second light emitting device is configured to emit a second color light having a second wavelength. The plurality of the pixel driving circuit comprises a first pixel driving circuit and a second pixel driving circuit. The first pixel driving circuit is electrically connected to the first light emitting device, and the second pixel driving circuit is electrically connected to the second light emitting device. By making the first coupling capacitor greater than the second coupling capacitor, the difference between the luminance change degree of the first light emitting device and the luminance change degree of the second light emitting device is adjusted, so as to improve the issue of the abnormal color mixing introduced by the different degrees of change in luminance of light emitting devices of different colors after the display panel switches from a high refresh rate to a low refresh rate.

DETAILED DESCRIPTION OF PREFERRED EMBODIMENTS

Figure 1:
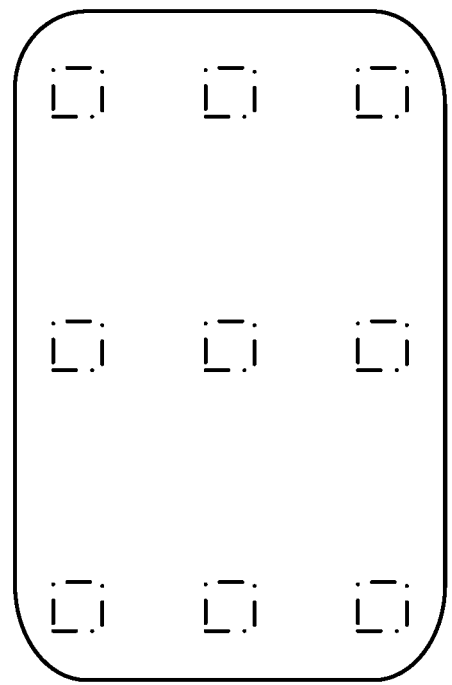
FIG. 1 is a diagram of test points for testing the luminance change of a display screen.

In order to make the purpose, technical solution and effect of the present application more clear and definite, the present disclosure will be further described in detail below with reference to the accompanying drawings and examples. It should be understood that the specific embodiments described here are only used to explain the present application, not to limit the present application. In this application, unless stated to the contrary, the used orientation words such as "up" and "down" usually refer to up and down in the actual use or working state of the device, specifically the direction of the drawing in the drawings; while "inside" and "outside" refer to the outline of the device.

Please refer to FIG. 1. FIG. 1 is a diagram of test points for testing the luminance change of a display screen. When the display panel switches from 120 Hz (high refresh rate) to 1 Hz (low refresh rate), a single-color luminance change test with Demura (a compensation method that compensates for color differences that can be recognized by the human eye) is performed on the nine test points in FIG. 1. Accordingly, the luminance changes of light emitting devices that emit red, green, and blue light are shown in the following table:

| Color | Demura Off | | | Demura On | | |
|---|---|---|---|---|---|---|
| red | −10% | −11% | −14% | −18% | −20% | −20% |
| | −29% | −33% | −26% | −32% | −31% | −36% |
| | −12% | −12% | −14% | −24% | −27% | −28% |
| green | −11% | −9% | −6% | −13% | −10% | −10% |
| | −20% | −12% | −18% | −33% | −22% | −18% |
| | −9% | −8% | −7% | −14% | −14% | −10% |
| blue | −4% | −0% | −2% | −1% | −2% | −1% |
| | −2% | −1% | −2% | −3% | −2% | −3% |
| | −1% | −3% | −2% | −3% | −4% | −3% |

According to the analysis of the test results, after the display panel switches from a high refresh rate to a low refresh rate, the luminance change degree of the light emitting device emitting red light is greater than the luminance change degree of the light emitting device emitting green light, and the luminance change degree of the light emitting device emitting green light is greater than the luminance change degree of the light emitting device emitting blue light. The different luminance change degrees of the light emitting devices emitting red light, green light and blue light lead to abnormal color mixing issues in the display panel (for example, the color coordinate offset corresponding to the formation of white color is serious, and the white picture obtained by color mixing is abnormally displayed: similarly, the other colors also have the same issues of abnormal color mixing). At high gray and low gray levels, the charging process of capacitors in pixel driving circuits is somewhat different. Therefore, at different gray levels, the effect of adjusting the reset signal transmitted by the reset signal line is also different. At high gray levels, the reset signal increases in the maintaining frame. After the display panel switches from a high refresh rate to a low refresh rate, the luminance of the display panel gradually decreases. Conventionally, the high gray-level luminance changes can be improved by adjusting the data signal and inserting more black frames during the maintaining frame. However, the low gray-level luminance changes are large and cannot be improved.

Figure 2A:
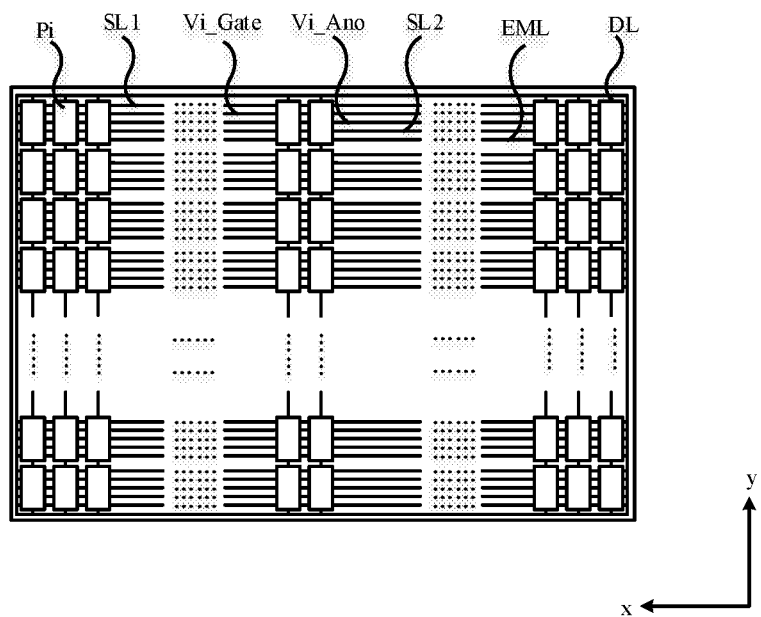
FIG. 2A-2C are diagrams of a display panel according to an embodiment of the present disclosure.
Figure 2B:
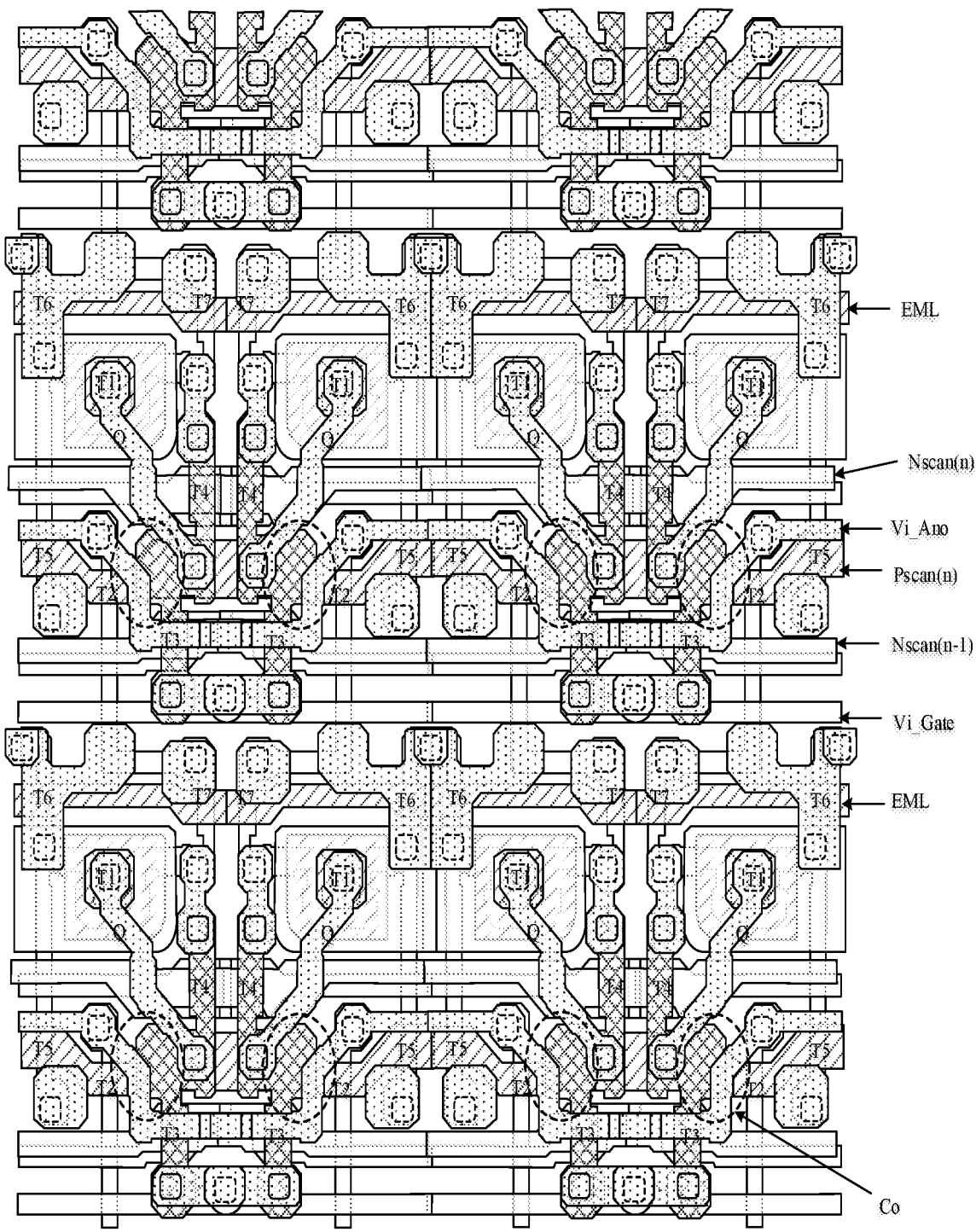
Figure 2C:
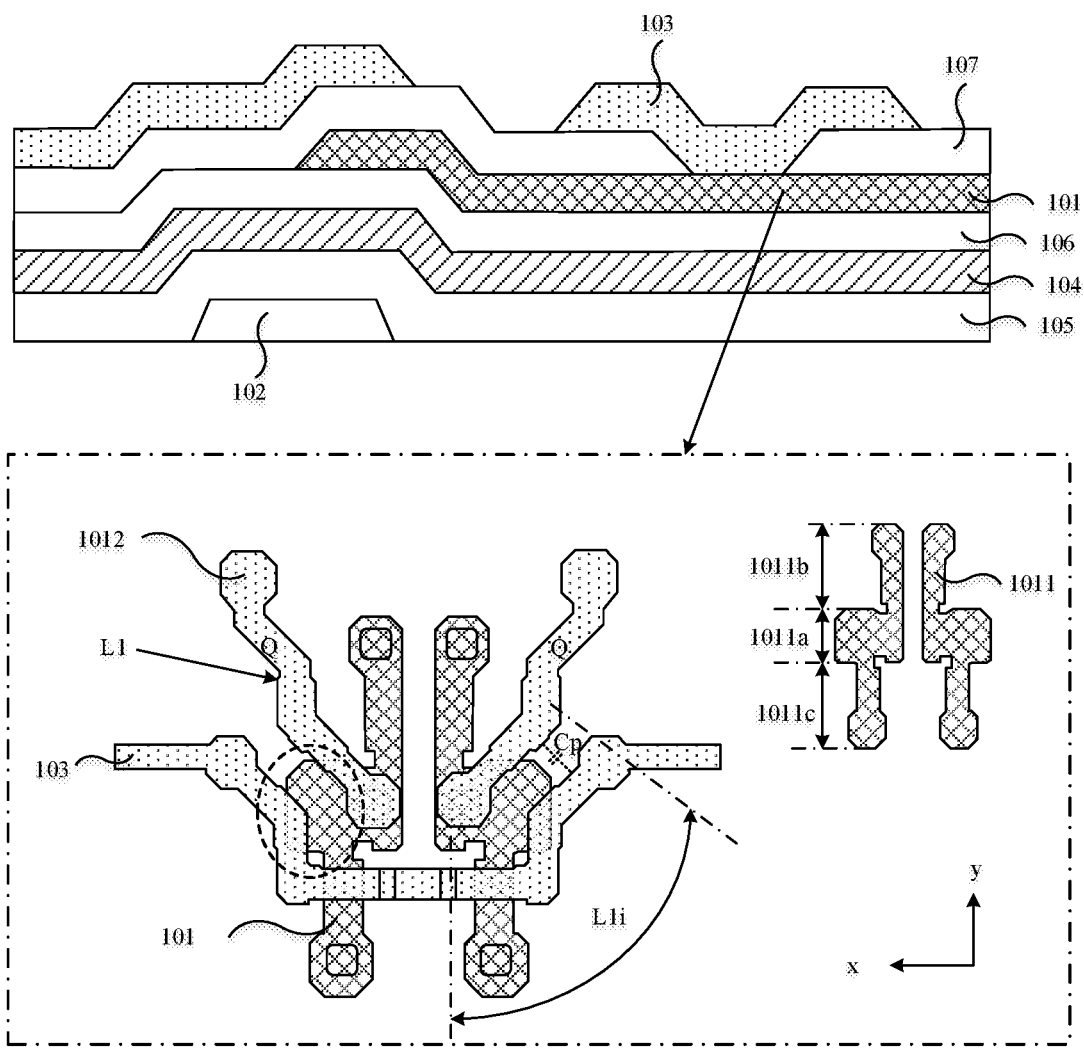

In order to improve the aforementioned issue that the display panel has abnormal color mixing due to the different luminance change degrees of the light emitting devices of different colors after switching from a high refresh rate to a low refresh rate, a display panel is disclosed according to an embodiment of the present disclosure. Please refer to FIG. 2A-2C. FIG. 2A-2C are diagrams of a display panel according to an embodiment of the present disclosure. The display panel includes a substrate, a driving circuit layer and a light emitting device layer.

Optionally, the substrate comprises a flexible substrate and a rigid substrate. The substrate comprises a glass, a polyimide, and/or the like.

The driving circuit layer is disposed on one side of the substrate. The driving circuit layer comprises a plurality of gating driving circuits, a plurality of pixel driving circuits, a plurality of data lines DL, a plurality of scan lines, a plurality of light emitting control signal lines EML, a plurality of reset signal lines Vi_Ano and a plurality of gate reset signal lines Vi_Gate.

The light emitting device layer is disposed on the side of the driving circuit layer facing away from the substrate. The light emitting device layer comprises a plurality of the light emitting devices. Optionally, the light emitting devices Pi could include organic light emitting diodes (OLEDs), sub-millimeter light emitting diodes and mini light emitting diodes.

The light emitting devices Pi include a first light emitting device and a second light emitting device. The first color light emitted by the first light emitting device has a first wavelength, and the second color light emitted by the second light emitting device has a second wavelength. The first wavelength is greater than the second wavelength.

Optionally, the first color light is red light, and the second color light is green light.

A plurality of gating driving circuits are electrically connected to a plurality of pixel driving circuits via a plurality of scan lines and a plurality of light emitting control signal lines EML. Optionally, a plurality of gating driving circuits include a plurality of first gating driving circuits, a plurality of second gating driving circuits, and a plurality of third gating driving circuits. The plurality of scan lines include a plurality of first scan lines SL1 and a plurality of second scan lines SL2. The plurality of the first gating driving circuit output a plurality of first scan signals Pscan. The plurality of the second gating driving circuit output a plurality of second scan signals Nscan. The plurality of the third gating driving circuit output a plurality of light emitting control signals EM.

In a write-in frame of a display period, each second scan signal Nscan outputted by the second gating driving circuit includes at least one valid pulse, and each first scan signal Pscan outputted by the first gating driving circuit includes at least one valid pulse. The valid pulse of the first scan signal Pscan and the valid pulse of the second scan signal at least partially overlaps with each other. In a maintaining frame of the display period, each of the first gating driving circuit outputs the first scan signal Pscan comprising at least one valid pulse. That is, the second scan signal Nscan outputs a valid pulse only in the write-in frame.

One display period comprises only one write-in frame. Under the condition that the display panel adopts the adaptive refresh rate technology to display images, at least one of the display periods may include one write-in frame and at least one maintaining frame. In the maintaining frame, the display panel displays the same content as what is displayed in the corresponding write-in frame. That is, when the display panel displays images at a low refresh rate, the display period includes the write-in frame and the maintaining frame.

Optionally, the reset signal transmitted through the reset signal line Vi_Ano has a first voltage level in a write-in frame of the display period, and the reset signal has a second voltage level in the maintaining frame of the display period.

Optionally, when the first transistor T1 is a P-type transistor, the first voltage level is greater than the second voltage level. By making the second voltage level of the reset signal in the maintaining frame lower than the first voltage level in the write-in frame, the voltage level of the first node Q of the pixel driving circuit electrically connected to the reset signal line Vi_Ano decreases, so that the channel of the first transistor T1 of the pixel driving circuit electrically connected to the reset signal line Vi_Ano becomes longer. Accordingly, the pixel driving circuit could provide a larger driving current to the light emitting device Pi.

Optionally, when the first transistor T1 is an N-type transistor, the first voltage level is lower than the second voltage level. Thus, the voltage level of the first node Q of the pixel driving circuit electrically connected to the reset signal line Vi_Ano increases, so that the channel of the first transistor T1 of the pixel driving circuit electrically connected to the reset signal line Vi_Ano becomes longer. Accordingly, the pixel driving circuit could provide a larger driving current to the light emitting device Pi.

The data signal transmitted by the data line DL has a third voltage level in the write-in frame and has a fourth voltage level in the maintaining frame. The third voltage value is not equal to the fourth voltage value. The timing when the data signal jumps from the third voltage level to the fourth voltage level is the same as the timing when the reset signal number jumps from the first voltage level to the second voltage level, so that the reset signal transmitted by the reset signal line Vi_Ano changes synchronously with the change of the data signal, thereby reducing the impact of writing data in the write-in frame.

The plurality of pixel driving circuits are electrically connected to a plurality of light emitting device Pi, a plurality of scan lines, a plurality of data lines DL, a plurality of light emitting control signal lines EML, a plurality of reset signal lines Vi_Ano and a plurality of gate reset signal lines Vi_Gate. The plurality of pixel driving circuits include a first pixel driving circuit and a second pixel driving circuit. The first pixel driving circuit is electrically connected to the first light emitting device, and the second pixel driving circuit is electrically connected to the second light emitting device.

Figure 3:
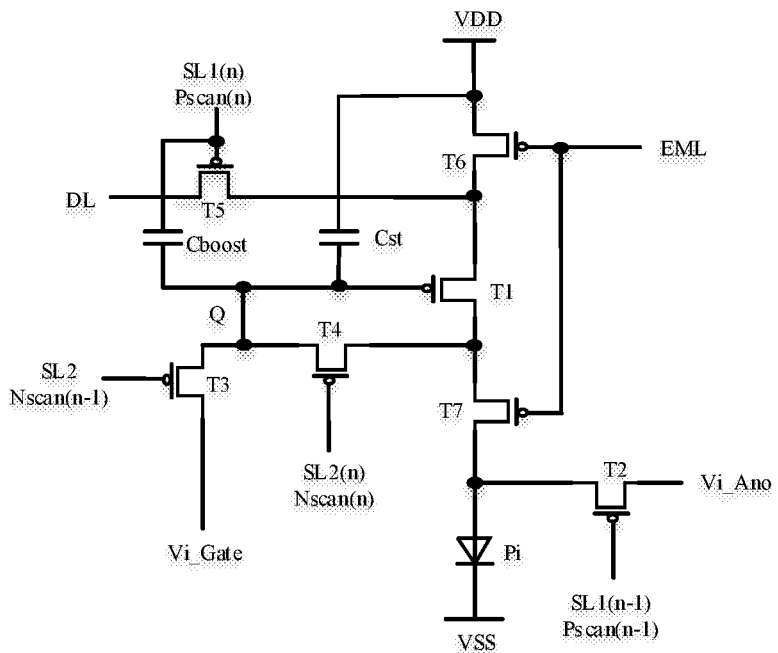
FIG. 3 is a diagram of a pixel driving circuit according to an embodiment of the present disclosure.

Please refer to FIG. 3. FIG. 3 is a diagram of a pixel driving circuit according to an embodiment of the present disclosure. Each pixel driving circuit includes a first transistor T1, a second transistor T2, a third transistor T3, a fourth transistor T4, a fifth transistor T5, a sixth transistor T6, a seventh transistor T7 and a first capacitor Cst.

The gate of the first transistor T1 is electrically connected to the first node Q, and the source and the drain of the first transistor T1 and the corresponding light emitting device Pi are electrically connected between the first voltage terminal VSS and the second voltage terminal VDD.

The gate of the second transistor T2 is electrically connected to the corresponding first gating driving circuit through the corresponding first scan signal line SL1, and the source and the drain of the second transistor T2 are electrically connected between the reset signal line Vi_Ano and the anode of the corresponding light emitting device Pi.

The gate of the third transistor T3 is electrically connected to the corresponding second gating driving circuit through the corresponding second scan signal line SL2, and the source and the drain of the third transistor T3 are electrically connected between the gate reset signal line Vi_Gate and the first node Q.

The gate of the fourth transistor T4 is electrically connected to the corresponding second gating driving circuit through the corresponding second scan signal line SL2, and the source and the drain of the fourth transistor T4 are electrically connected between the first node Q and one of the source and the drain of the first transistor T1.

The gate of the fifth transistor T5 is electrically connected to the corresponding first gating driving circuit through the corresponding first scan signal line SL1, and the source and the drain of the fifth transistor T5 are electrically connected between the corresponding data line DL and the other of the source and the drain of the first transistor T1.

The gate of the sixth transistor T6 and the gate of the seventh transistor T7 are electrically connected to the corresponding third gate driving circuit through the corresponding light emitting control signal line EML. The source and the drain of the sixth transistor T6 are electrically connected between the second voltage terminal VDD and the other of the source and the drain of the first transistor T1. The source and the drain of the seventh transistor T7 are electrically connected between one of the source and the drain of the first transistor T1 and the corresponding light emitting device Pi. The first capacitor Cst is connected in series between the first node Q and the second voltage terminal VDD.

Optionally, each pixel driving circuit further includes a second capacitor Cboost, which is connected in series between the first node Q and the gate of the fifth transistor T5.

A plurality of first gating driving circuits are electrically connected to the gates of the second transistors T2 and the gates of the fifth transistors T5 of the plurality of pixel driving circuits. Optionally, the gate of the second transistor T2 and the gate of the fifth transistor T5 of the same pixel driving circuit may be electrically connected with the same first gating driving circuit. For example, the gate of the second transistor T2 and the gate of the fifth transistor T5 of the same pixel driving circuit could be electrically connected to the first gating driving circuit, which outputs the $n^{th}$-stage scan signal Psacn(n), through the first scan line SL1. Optionally, the gate of the second transistor T2 and the gate of the fifth transistor T5 of the same pixel driving circuit are electrically connected to different first gating driving driving circuits. For example, the gate of the second transistor T2 is electrically connected to the first gating driving circuit, which outputs the $(n-1)^{th}$-stage scan signal Psacn(n-1), through the first scan line SL1. The gate of the fifth transistor T5 is electrically connected to the first gating driving circuit, which outputs the $n^{th}$-stage scan signal Psacn(n), through the first scan line SL1. Here, the number n is greater than or equal to 1.

A plurality of second gate driving circuits are electrically connected to the gates of the third transistors T3 and the gates of the fourth transistors T4 of a plurality of the pixel driving circuits. The gate of the fourth transistor and the gate of the third transistor T3 of the same pixel driving circuit are electrically connected to different second gating driving circuits through the corresponding second scan lines SL2. For example, the gate of the third transistor T3 is electrically connected to the second gating driving circuit, which outputs the $(n-1)^{th}$-stage second scan signal Nscan(n-1) through the second scan line SL2. The gate of the fourth transistor T4 is electrically connected to the second gating driving circuit, which outputs the $n^{th}$-stage second scan signal Nscan(n) through the second scan line SL2.

A plurality of third gating driving circuits are electrically connected to the gates of the sixth transistors T6 and the gates of the seventh transistors T7 of a plurality of the pixel driving circuits. The gate of the seventh transistor and the gate of the sixth transistor T6 of the same pixel driving circuit are electrically connected to the same third gating driving circuit through the light emitting control signal line EML.

Please refer to FIG. 2B. The reset signal line Vi_Ano and the corresponding pixel driving circuit have a coupling capacitor Co because the reset signal line Vi_Ano overlaps with the corresponding pixel driving circuit. When the reset signal transmitted by the reset signal line Vi_Ano changes, it affects the voltage level of the first node Q of the pixel driving circuit corresponding to the reset signal line Vi_Ano. The voltage change at the first node Q affects the driving current of the pixel driving circuit, thereby affecting the luminance of the corresponding light emitting device Pi.

Furthermore, the reset signal line Vi_Ano and the first node Q of the first pixel driving circuit have a first coupling capacitor, and the reset signal line Vi_Ano and the first node Q of the second pixel driving circuit have a second coupling capacitor. The first coupling capacitance of the first coupling capacitor is greater than the second coupling capacitance of the second coupling capacitor. Since the first coupling capacitance is greater than the second coupling capacitance, after the display panel switches from a high refresh rate to a low refresh rate, the charging speed of the first coupling capacitor will be lower than the charging speed of the second coupling capacitor. This makes the change speed of the voltage level of the first node Q of the first pixel driving circuit lower than that change speed of the voltage level of the first node Q of the second pixel driving circuit. Accordingly, the difference of the luminance change of the first light emitting device and the luminance change of the second light emitting device could be reduced in contrast to the conventional art (in the conventional art, when the first coupling capacitance is equal to the second coupling capacitance, the luminance change of the first light emitting device is faster than the luminance change amplitude of the second light emitting device). Therefore, it can improve the color mixing abnormal issue of a display panel due to the different luminance changes of light emitting device of different colors after the display panel switches from a high refresh rate to a low refresh rate. Specifically, it can improve the color mixing abnormal issue of a display panel at a low grey value due to the different luminance changes of light emitting device of different colors after the display panel switches from a high refresh rate to a low refresh rate.

Optionally, the plurality of light emitting devices Pi further comprises a third light emitting device. The third light emitting device emits a third color light having a third wavelength. The third wavelength is shorter than the second wavelength. The third color light is blue light.

The plurality of pixel driving circuits further comprise a third pixel driving circuit. The reset signal line Vi_Ano and the first node Q of the third pixel driving circuit have a third coupling capacitor. The second coupling capacitance of the second coupling capacitor is greater than the third coupling capacitance of the third coupling capacitor. Since the first coupling capacitance is greater than the second coupling capacitance and the second coupling capacitance is greater than the third coupling capacitance. after the display panel switches from a high refresh rate to a low refresh rate, the charging speed of the first coupling capacitor is slower than the charging speed of the second coupling capacitor, and the charging speed of the second coupling capacitor is slower than the charging speed of the third coupling capacitor. In this way, the change speed of the voltage level of the first node Q of the first pixel driving circuit is slower than the change speed of the voltage level of the first node Q of the second pixel driving circuit. The change speed of the voltage level of the first node Q of the second pixel driving circuit is slower than the change speed of the voltage level of the first node Q of the third pixel driving circuit. Therefore, the difference among the luminance change of the first light emitting device, the luminance change of the second light emitting device and the luminance change of the third light emitting device is reduced in contrast to the conventional art. This can improve the problem that the display panel has abnormal color mixing after switching from a high refresh rate to a low refresh rate.

Optionally, the first coupling capacitance is 1.1 times to 2.2 times of the second coupling capacitance, and the third coupling capacitance is 0.2 times to 0.9 times of the second coupling capacitance. Accordingly, after the reset signal jumps from the first voltage level to the second voltage level, the voltage change of the first node caused by the voltage change of the reset signal could be reduced. Thus, the influence on the displayed color of the display panel is reduced as well.

Optionally, the first coupling capacitance is 1.1 times, 1.2 times, 1.3 times, 1.4 times, 1.45 times, 1.5 times, 1.55 times, 1.6 times, 1.7 times, 1.8 times, 1.9 times, 2 times, 2.1 times, or 2.2 times of the second coupling capacitance. The third coupling capacitance is 0.2 times, 0.22 times, 0.25 times, 0.27 times, 0.3 times, 0.4 times, 0.5 times, 0.55 times, 0.6 times, 0.7 times, 0.8 times, or 0.9 times of the second coupling capacitance.

Optionally, the first coupling capacitance ranges between 0.3 and 0.6 farad (F). Optionally, the first coupling capacitance is 0.3 F, 0.32 F, 0.35 F, 0.38 F, 0.4 F, 0.42 F, 0.45 F, 0.484 F, 0.5 F, 0.52 F, 0.53 F, 0.55 F, 0.56 F, 0.57 F, 0.58 F, 0.59 F, or 0.6 F.

Optionally, the second coupling capacitance ranges between 0.3 and 0.6 farad (F). Optionally, the second coupling capacitance is 0.3 F, 0.32 F, 0.35 F, 0.38 F, 0.4 F, 0.42 F, 0.45 F, 0.484 F, 0.5 F, 0.52 F, 0.53 F, 0.55 F, 0.56 F, 0.57 F, 0.58 F, 0.59 F, or 0.6 F.

Optionally, the third coupling capacitance ranges between 0.3 and 0.6 farad (F). Optionally, the third coupling capacitance is 0.3 F, 0.32 F, 0.35 F, 0.38 F, 0.4 F, 0.42 F, 0.45 F, 0.484 F, 0.5 F, 00.3 F, 0.32 F, 0.35 F, 0.38 F, 0.4 F, 0.42 F, 0.45 F, 0.484 F, 0.5 F, 0.52 F, 0.53 F, 0.55 F, 0.56 F, 0.57 F, 0.58 F, 0.59 F, or 0.6 F.

Please refer to FIG. 2C again. The driving circuit layer further comprises a first active layer 101, a second active layer 102, a source/drain layer 103, a first gate layer 104, a first gate insulating layer 105, the second gate insulating layer 106 and the interlayer dielectric layer 107.

The first active layer 101 includes a plurality of spaced-arranged first portions 1011 (the local enlargement in FIG. 2C is a structural diagram of the first portion 1011 in the top view). Each of the first portions 1011 includes a first sub-portion 1011a, a second sub-portion 1011b and a third sub-portion 1011c. The second sub-portion 1011b and the third sub-portion 1011c extend from both ends of the first sub-portion 1011a to the direction facing away from the first sub-portion 1011a and are disposed in a way diverging from each other. The conductivity of the first sub-portion 1011a is higher than conductivities of the second sub-portion 1011b and the sub-portion 1011c.

Optionally, the first active layer 101 includes a metal oxide semiconductor material. The first active layer 101 includes an active pattern of the third transistor T3 and an active pattern of the fourth transistor T4. The second sub-portion 1011b is used as the active pattern of the fourth transistor T4, and the third sub-portion 1011c is used as the active pattern of the third transistor T3. The first sub-portion 1011a is used to electrically connect the second sub-portion 1011b to the third sub-portion 1011c.

The second active layer 102 is located under the first active layer 101. Optionally, the second active layer 102 comprises a silicon semiconductor material. The second active layer 102 comprises an active pattern of the first transistor T1 and an active pattern of the second transistor T2.

The source/drain layer 103 is located on the first active layer 101. The source/drain layer 103 includes a plurality of reset signal lines Vi_Ano. The reset signal line Vi_Ano at least partially overlaps with the first sub-portion 1011a to form a vertical coupling capacitor. Each of the first coupling capacitor, the second coupling capacitor, and the third coupling capacitor includes the vertical coupling capacitor.

Furthermore, the overlapping area of the first sub-portion 1011a of the first pixel driving circuit and the reset signal line Vi_Ano is greater than the overlapping area of the first sub-portion 1011a of the second pixel driving circuit and the reset signal line of the Vi_Ano. The overlapping area of the first sub-portion 1011a of the second pixel driving circuit and the reset signal line Vi_Ano is greater than the overlapping area of the first sub-portion 1011a of the third pixel driving circuit such that the first coupling capacitance of the first coupling capacitor is greater than the second coupling capacitance of the second coupling capacitor, and the second coupling capacitance of the second coupling capacitor is greater than the third capacitance of the third coupling capacitor.

Optionally, the width of the first sub-portion 1011a in the first direction x is greater than the widths of the second sub-portion 1011b and the third sub-portion 1011c in the first direction x. The first direction x intersects with the extended direction y of the second sub-portion 1011b and the third sub-portion 1011c.

The first gate layer 104 is located between the first active layer 101 and the second active layer 102. The first gate layer 104 includes a plurality of first scan lines SL1 for transmitting first scan signals Pscan and light emitting control signal lines EML.

The first gate insulating layer 105 is located between the second active layer 102 and the first gate layer 104. The second gate insulating layer 106 is located between the first active layer 101 and the first gate layer 104. The interlayer dielectric layer 107 is located between the first active layer 101 and the source/drain layer 103.

Optionally, the driving circuit layer further comprises a second gate layer, a third gate layer, and the like not shown.

Optionally, the second gate layer and the third gate layer are located between the first gate layer 104 and the source/drain layer 103. Optionally, the second gate layer comprises a gate reset signal line Vi_Gate. The third gate layer comprises a plurality of second scan lines SL2 for transmitting a second scan signal Nscan.

Please refer to FIG. 2B and FIG. 2C again. The source/drain layer 103 further comprises a second potion 1012 positioned with an internal with the reset signal line Vi_Ano. The second portion 1012 is electrically connected between the first sub-portion 1011a and the first node Q, and the second portion 1012 is and the reset signal line Vi_Ano form a parallel coupling capacitor Cp. Each of the first coupling capacitor, the second coupling capacitor, and the third coupling capacitor comprises the parallel coupling capacitor Cp.

Optionally, the second portion 1012 of each pixel driving circuit comprises a first side L1 close to the reset signal line Vi_Ano. The length of the first side L1 of the first pixel driving circuit exactly facing a corresponding reset signal line Vi_Ano (the length of the first side L1 corresponding to the range L1i shown in FIG. 2B) is greater than the length of the first side L1 of the second pixel driving circuit exactly facing a corresponding reset signal line Vi_Ano. The length of the first side L1 of the second pixel driving circuit exactly facing the corresponding reset signal line Vi_Ano is greater than the length of the first side L1 of the third pixel driving circuit exactly facing a corresponding reset signal line Vi_Ano. In this way, the first coupling capacitance of the first coupling capacitor is greater than the second coupling capacitance of the second coupling capacitor. The second coupling capacitance of the second coupling capacitor is greater than the third coupling capacitance of the third coupling capacitor.

Figure 4:
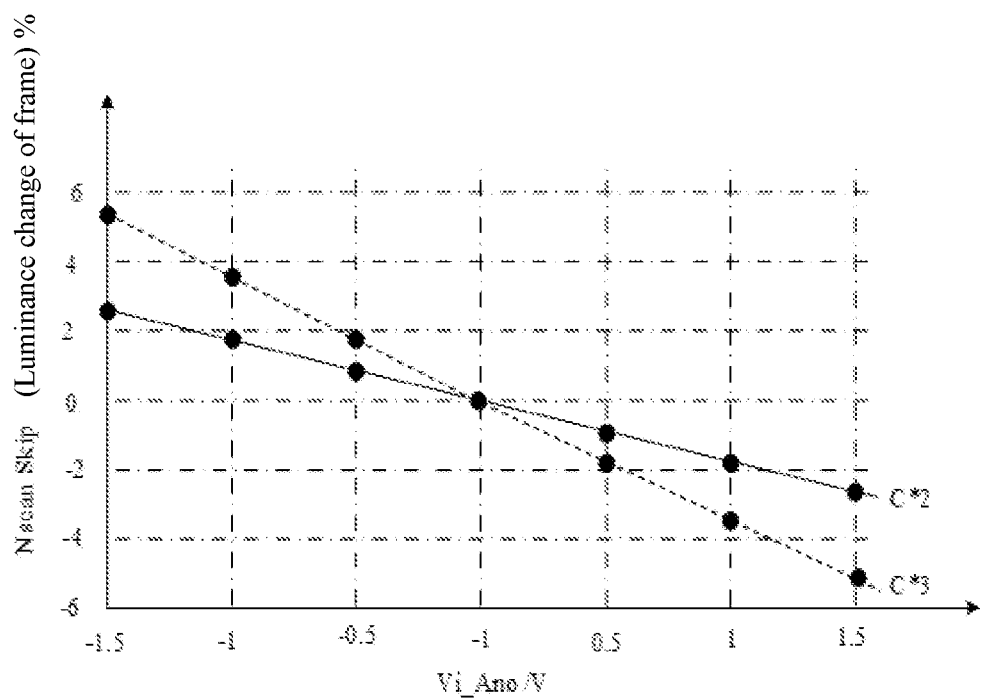
FIG. 4 is a diagram of a luminance change percentage of the second light emitting device according to an embodiment of the present disclosure.

Please refer to FIG. 4. FIG. 4 is a diagram of a luminance change of the second light emitting device according to an embodiment of the present disclosure. Here, the x-axis represents the range of change of the reset signal. "Nscan skip" in the y-axis indicates that the second scan signal Nscan frequency is reduced from a high refresh rate to a low refresh rate. The frequencies of the first scan signal Pscan and the light emitting control signal EM The frequency remain the same, and the data signal jumps from the third voltage level to the fourth voltage level. C*2 indicates that the second capacitance of the second coupling capacitor used in the simulation is double of the second capacitance of the second coupling capacitor in the conventional art, and C*3 indicates that the second capacitance of the second coupling capacitor used in the simulation is triple of the second capacitance of the second coupling capacitor in the conventional art.

The present disclosure uses different second coupling capacitors under different reset signals, and simulates the brightness change of the second light-emitting device. According to the simulation results, the increase of the second coupling capacitance will improve the change of the reset signal (the change of the reset signal is the change from the first voltage level to the second voltage level. For example, when the first transistor T1 in the second pixel driving circuit is a P-type transistor, so that the first voltage level is higher than the second voltage level). When the coupling capacitors are designed, the capacitances of the coupling capacitors can be as large as possible to have a better low gray scale compensation effect. Here, the diagram of the luminance change percentage of the first light emitting device under different first coupling capacitors and different corresponding reset signals and the diagram of the luminance change percentage of the third light emitting device under different third coupling capacitors and different corresponding reset signals are similar to the diagram of the luminance change percentage of the second light emitting device under different second coupling capacitors and different corresponding reset signals. For simplicity, this will not be repeated here. Based on the analysis results of the luminance change percentage of the first light-emitting device, the second light-emitting device and the third light-emitting device, it is verified that if the first coupling capacitance is greater than the second coupling capacitance and the second coupling capacitance is greater than the third coupling capacitance, the difference among the luminance change degree of the first light-emitting device, the luminance change degree of the second light-emitting device and the luminance change degree of the third light-emitting device can be adjusted, so as to improve the abnormal color mixing issue of the display panel after the display panel switches from a high refresh rate to a low refresh rate.

According to an embodiment of the present disclosure, a display device is further disclosed. The display device comprises any of the above-mentioned display panels. It could be understood that the display device comprises a removable display device (e.g., a laptop, a mobile phone, etc.), a fixed terminal (e.g., a desktop computer, a television, etc.), a measuring device (e.g., a sports bracelet, thermometer, etc.), etc.

Above are embodiments of the present disclosure, which does not limit the scope of the present disclosure. Any modifications, equivalent replacements or improvements within the spirit and principles of the embodiment described above should be covered by the protected scope of the disclosure.

What is claimed is:

1. A display panel, comprising:
    a substrate;
    a driving circuit layer, disposed on one side of the substrate, the driving circuit layer comprising:
        a plurality of pixel driving circuits, each of the pixel driving circuits comprising a first transistor, a second transistor and a first node, wherein a gate of the first transistor is electrically connected to the first node, a source and a drain of the first transistor and a corresponding light emitting device are electrically connected between a first voltage terminal and a second voltage terminal, a source and a drain of the second transistor are electrically connected between a reset signal line and a corresponding anode of the corresponding light emitting device; and
    a light emitting device layer, disposed on a side of the driving circuit layer facing away from the substrate, the light emitting device layer comprising:
        a plurality of the light emitting devices, comprising:
            a first light emitting device, configured to emit a first color light having a first wavelength; and
            a second light emitting device, configured to emit a second color light having a second wavelength;
    wherein the plurality of the pixel driving circuit comprises a first pixel driving circuit and a second pixel driving circuit, the first pixel driving circuit is electrically connected to the first light emitting device, and the second pixel driving circuit is electrically connected to the second light emitting device;
    wherein the first wavelength is greater than the second wavelength; the reset signal line and the first node of the first pixel driving circuit have a first coupling capacitor, the reset signal line and the first node of the second pixel driving circuit have a second coupling capacitor, and a first coupling capacitance of the first coupling capacitor is greater than a second coupling capacitance of the second coupling capacitor.

2. The display panel of claim 1, wherein each pixel driving circuit further comprises a third transistor, a source and a drain of the third transistor are electrically connected between a gate reset signal line and the first node; and the display panel further comprises:
    a plurality of first gating driving circuits, electrically connected to gates of the second transistors in the plurality of pixel driving circuits; and
    a plurality of second gating driving circuits, electrically connected to gates of the third transistors in the plurality of pixel driving circuits;
    wherein within a write-in frame of a display period, a second scan signal outputted by each second gating driving circuit comprises at least one valid pulse, and a first scan signal outputted by each first gating driving circuit comprises at least one valid pulse; within a maintaining frame of the display period, the first scan signal outputted by each of the first gating driving circuits comprises at least one valid pulse.

3. The display panel of claim 2, wherein the plurality of the light emitting device further comprises a third light emitting device, configured to emit a third color light having a third wavelength, shorter than the second wavelength;
    wherein the plurality of the pixel driving circuit further comprises a third pixel driving circuit, and a third coupling capacitor is electrically connected between the reset signal line and the first node of the third pixel driving circuit; and
    wherein the second coupling capacitance of the second coupling capacitor is greater than a third coupling capacitance of the third coupling capacitor.

4. The display panel of claim 3, wherein the first coupling capacitance is 1.1 times to 2.2 times of the second coupling capacitance, and the third coupling capacitance is 0.2 times to 0.9 times of the second coupling capacitance.

5. The display panel of claim 4, wherein the first coupling capacitance ranges between 0.3F and 0.6 farad (F), the second coupling capacitance ranges between 0.3F and 0.6F, and the third coupling capacitance ranges between 0.3F and 0.6F.

6. The display panel of claim 3, wherein the driving circuit layer comprises:
    a first active layer, comprising a plurality of spaced-positioned first portions, each of the first portion comprising a first sub-portion, a second sub-portion, and a third sub-portion, wherein the second sub-portion and the third sub-portion respectively extend from both ends of the first sub-portion in the direction away from the first sub-portion and are disposed in a way diverging from each other, and a conductivity of the first sub-portion is higher than conductivities of the second sub-portion and the third sub-portion; and
    a source/drain layer, placed above the first active layer, comprising the reset signal line, which at least partially overlaps with the first sub-portion to form a vertical coupling capacitor;
    wherein the first coupling capacitor, the second coupling capacitor, and the third coupling capacitor all include the vertical coupling capacitor.

7. The display panel of claim 6, wherein an overlapping area of the first sub-portion of the first pixel driving circuit and the reset signal line is greater than an overlapping area of the first sub-portion of the second pixel driving circuit and the reset signal line; and the overlapping area of the first sub-portion of the second pixel driving circuit and the reset signal line is greater than an overlapping area of the first sub-portion of the third pixel driving circuit and the reset signal line.

8. The display panel of claim 6, wherein each of the pixel driving circuits further comprises a fourth transistor, wherein a gate of the fourth transistor is electrically connected to a corresponding second gating driving circuit, a source and a drain of the fourth transistor are electrically connected between the first node and one of the source and the drain of the first transistor;

wherein the driving circuit layer further comprises:
a second active layer, located under the first active layer, comprising a silicon semiconductor material, wherein the second active layer comprises an active pattern of the first transistor and an active pattern of the second transistor;
wherein the first active layer comprises a metal oxide semiconductor material; and the first active layer comprises an active pattern of the third transistor and an active pattern of the fourth transistor.

9. The display panel of claim 8, wherein a width of the first sub-portion along the first direction is greater than a width of the second sub-portion and the third sub-portion along the first direction, and the first direction intersects an extension direction of the second sub-portion and the third sub-portion; and wherein the second sub-portion is configured as the active pattern of the fourth transistor, the third sub-portion is configured as the active pattern of the third transistor, and the first sub-portion is configured to electrically connect the second sub-portion and the third sub-portion.

10. The display panel of claim 6, wherein the source/drain layer further comprises a second part arranged at an interval with the reset signal line, the second part is electrically connected between the first sub-portion and the first node, and the second part and the reset signal line form a parallel coupling capacitor; and wherein the first coupling capacitor, the second coupling capacitor, and the third coupling capacitor all include the parallel coupling capacitor.

11. The display panel of claim 10, wherein the second part of each pixel driving circuit comprises a first side close to the reset signal line;

wherein a length of the first side of the first pixel driving circuit exactly facing a corresponding reset signal line is greater than a length of the first side of the second pixel driving circuit exactly facing a corresponding reset signal line; a length of the first side of the second pixel driving circuit exactly facing the corresponding reset signal line is greater than a length of the first side of the third pixel driving circuit exactly facing a corresponding reset signal line.

12. The display panel of claim 2, wherein a reset signal transmitted by the reset signal line has a first voltage level in a write-in frame of the display period, the reset signal has a second voltage level in the maintaining frame; and the first voltage level is higher than the second voltage level.

13. The display panel of claim 12, wherein, each of the pixel driving circuits further comprises a fifth transistor, a gate of the fifth transistor is electrically connected to a corresponding first gating driving circuit, a source and a drain of the fifth transistor are electrically connected between the data line and the source and the drain of the first transistor; and wherein a data signal transmitted by a data line has a third voltage level in the write-in frame, the data signal has a fourth voltage level in the maintaining frame, the third voltage value is not equal to the fourth voltage value; and a timing when the data signal jumps from the third voltage level to the fourth voltage level is identical to a timing when the reset signal jumps from the first voltage level to the second voltage level.

14. The display panel of claim 2, further comprising a plurality of third gating driving circuits; wherein each of the pixel driving circuits further comprises:
a sixth transistor, wherein a source and a drain of the sixth transistor are electrically connected between the second voltage terminal and one of the source and the drain of the first transistor;
a seventh transistor, wherein a gate of the sixth transistor and a gate of the seventh transistor are electrically connected to a corresponding third gating driving circuit, a source and a drain of the seventh transistor are electrically connected between one of the source and the drain of the first transistor and a corresponding light emitting device; and
a first capacitor, connected in series between the first node and the second voltage terminal.

15. The display panel of claim 3, wherein the first color light is red light, the second color light is green light, and the third color light is blue light.

16. A display device, comprising a display panel, the display panel comprising:
a substrate;
a driving circuit layer, disposed on one side of the substrate, the driving circuit layer comprising:
a plurality of pixel driving circuits, each of the pixel driving circuits comprising a first transistor, a second transistor and a first node, wherein a gate of the first transistor is electrically connected to the first node, a source and a drain of the first transistor and a corresponding light emitting device are electrically connected between a first voltage terminal and a second voltage terminal, a source and a drain of the second transistor are electrically connected between a reset signal line and a corresponding anode of the corresponding light emitting device; and
a light emitting device layer, disposed on a side of the driving circuit layer facing away from the substrate, the light emitting device layer comprising:
a plurality of the light emitting devices, comprising:
a first light emitting device, configured to emit a first color light having a first wavelength; and
a second light emitting device, configured to emit a second color light having a second wavelength;
wherein the plurality of the pixel driving circuit comprises a first pixel driving circuit and a second pixel driving circuit, the first pixel driving circuit is electrically connected to the first light emitting device, and the second pixel driving circuit is electrically connected to the second light emitting device;
wherein the first wavelength is greater than the second wavelength; the reset signal line and the first node of the first pixel driving circuit have a first coupling capacitor, the reset signal line and the first node of the second pixel driving circuit have a second coupling capacitor, and a first coupling capacitance of the first coupling capacitor is greater than a second coupling capacitance of the second coupling capacitor.

17. The display device of claim 16, wherein each pixel driving circuit further comprises a third transistor, a source and a drain of the third transistor are electrically connected between a gate reset signal line and the first node; and the display panel further comprises:
- a plurality of first gating driving circuits, electrically connected to gates of the second transistors in the plurality of pixel driving circuits; and
- a plurality of second gating driving circuits, electrically connected to gates of the third transistors in the plurality of pixel driving circuits;
- wherein within a write-in frame of a display period, a second scan signal outputted by each second gating driving circuit comprises at least one valid pulse, and a first scan signal outputted by each first gating driving circuit comprises at least one valid pulse; within a maintaining frame of the display period, the first scan signal outputted by each of the first gating driving circuits comprises at least one valid pulse.

18. The display device of claim 17, wherein the plurality of the light emitting device further comprises a third light emitting device, configured to emit a third color light having a third wavelength, shorter than the second wavelength;
- wherein the plurality of the pixel driving circuit further comprises a third pixel driving circuit, and a third coupling capacitor is electrically connected between the reset signal line and the first node of the third pixel driving circuit; and
- wherein the second coupling capacitance of the second coupling capacitor is greater than a third coupling capacitance of the third coupling capacitor.

19. The display device of claim 18, wherein the driving circuit layer comprises:
- a first active layer, comprising a plurality of spaced-positioned first portions, each of the first portion comprising a first sub-portion, a second sub-portion, and a third sub-portion, wherein the second sub-portion and the third sub-portion respectively extend from both ends of the first sub-portion in the direction away from the first sub-portion and are disposed in a way diverging from each other, and a conductivity of the first sub-portion is higher than conductivities of the second sub-portion and the third sub-portion; and
- a source/drain layer, placed above the first active layer, comprising the reset signal line, which at least partially overlaps with the first sub-portion to form a vertical coupling capacitor;
- wherein the first coupling capacitor, the second coupling capacitor, and the third coupling capacitor all include the vertical coupling capacitor.

20. The display device of claim 19, wherein the source/drain layer further comprises a second part arranged at an interval with the reset signal line, the second part is electrically connected between the first sub-portion and the first node, and the second part and the reset signal line form a parallel coupling capacitor; and
- wherein the first coupling capacitor, the second coupling capacitor, and the third coupling capacitor all include the parallel coupling capacitor.

* * * * *